United States Patent
Cher et al.

(10) Patent No.: US 10,365,702 B2
(45) Date of Patent: Jul. 30, 2019

(54) AUTONOMIC SUPPLY VOLTAGE COMPENSATION FOR DEGRADATION OF CIRCUITS OVER CIRCUIT LIFETIME

(71) Applicant: International Business Machines Corporation, Armonk, NY (US)

(72) Inventors: Chen-Yong Cher, Port Chester, NY (US); Pierce I Chuang, Briarcliff, NY (US); Keith A Jenkins, Sleepy Hollow, NY (US); Barry Linder, Hastings-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 15/482,917

(22) Filed: Apr. 10, 2017

(65) Prior Publication Data

US 2018/0292879 A1  Oct. 11, 2018

(51) Int. Cl.
| | |
|---|---|
| G06F 1/3206 | (2019.01) |
| G01R 31/28 | (2006.01) |
| G01R 19/00 | (2006.01) |
| G06F 1/3296 | (2019.01) |
| G06F 1/3237 | (2019.01) |

(52) U.S. Cl.
CPC ....... G06F 1/3206 (2013.01); G01R 19/0092 (2013.01); G01R 31/2832 (2013.01); G06F 1/3296 (2013.01); G06F 1/3237 (2013.01)

(58) Field of Classification Search
CPC .... G06F 1/3206; G06F 1/3287; G06F 1/3296; G01R 19/0092; G01R 31/2832
See application file for complete search history.

(56) References Cited

U.S. PATENT DOCUMENTS

| | | | |
|---|---|---|---|
| 6,597,193 B2 | 7/2003 | Lagowski et al. | |
| 6,603,356 B1 * | 8/2003 | Kim | H03F 1/308 330/2 |
| 6,820,220 B1 * | 11/2004 | Dominke | G05B 19/0428 713/340 |
| 6,882,172 B1 | 4/2005 | Suzuki et al. | |
| 6,900,690 B2 | 5/2005 | Kang et al. | |
| 7,149,674 B1 | 12/2006 | Sirichotiyakul et al. | |
| 8,736,314 B2 | 5/2014 | Kim | |
| 9,223,327 B1 * | 12/2015 | Zhu | G05F 1/10 |
| 2005/0030185 A1 * | 2/2005 | Huisenga | G01R 19/2509 340/635 |

(Continued)

OTHER PUBLICATIONS

3. J. Keane, et al., "An All-In-One Silicon Odometer for Separately Monitoring HCI, BTI, and TDDP," in IEEE Journal of Solid-State Circuits, vol. 45, No. 4, pp. 817-829, Apr. 2010.

(Continued)

*Primary Examiner* — Austin Hicks
(74) *Attorney, Agent, or Firm* — Harrington & Smith

(57) ABSTRACT

Over at least part of a lifetime of a product circuit, quiescent current to a product circuit is periodically measured. Over the part of the lifetime of the product circuit, voltage to the product circuit is periodically adjusted based on the monitored quiescent current. Methods, apparatus, and computer program product are disclosed. A calibration procedure may also be performed as part of manufacturing the product circuit, in order to provide values for the quiescent current and corresponding voltage to which the voltage should be adjusted.

19 Claims, 11 Drawing Sheets

(56) References Cited

U.S. PATENT DOCUMENTS

| | | | |
|---|---|---|---|
| 2011/0181315 A1* | 7/2011 | Krishnan | G01R 31/3016 |
| | | | 324/762.01 |
| 2012/0053897 A1 | 3/2012 | Naffziger | |
| 2016/0179164 A1* | 6/2016 | Park | G06F 1/324 |
| | | | 713/322 |
| 2017/0104631 A1* | 4/2017 | Chae | H04L 41/0823 |

OTHER PUBLICATIONS

8. Minki Cho, et al., "Post-Silicon Voltage-Guard-Band Reduction in a 22nm Graphics Execution Core Using Adaptive Voltage Scaling and Dynamic Power Gating", ISSCC 2016 paper 8.4.

* cited by examiner

AUTONOMIC SUPPLY VOLTAGE COMPENSATION FOR DEGRADATION OF CIRCUITS OVER CIRCUIT LIFETIME

GOVERNMENT RIGHTS

This invention was made with Government support under contract HR0011-13-C-0022 awarded by the Defense Advanced Research Projects Agency (DARPA). The Government has certain rights in this invention.

BACKGROUND

This invention relates generally to circuits and, more specifically, relates to autonomic compensation for degradation of circuits such as caused by bias-temperature instability and/or hot carrier injection, over the lifetime of the circuits.

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section. Abbreviations and acronyms used in this document and/or the drawings are defined below, prior to the claims.

Degradation of FETs due to bias-temperature instability (BTI) and hot-carrier injection (HCI) is inevitable in CMOS technology. FET degradation leads to performance reduction because the threshold voltage increases. In today's common practice, static, higher-than-needed operating voltage (a so-called 'guard-band') is used to allow for correct operation throughout life of product based on predicted life-time degradation. Since voltage increases degradation, this actually slightly accelerates the problem.

BRIEF SUMMARY

This section is intended to include examples and is not intended to be limiting.

In an exemplary embodiment, a method comprises periodically, over at least part of a lifetime of a product circuit, monitoring quiescent current to a product circuit. The method also comprises periodically, over the part of the lifetime of the product circuit, adjusting voltage to the product circuit based on the monitored quiescent current.

In another exemplary embodiment, an apparatus comprises a product circuit and a controller. The controller is configured to periodically, over at least part of a lifetime of a product circuit, monitor quiescent current to the product circuit, and to periodically, over the part of the lifetime of the product circuit, adjust voltage to the product circuit based on the monitored quiescent current.

A further exemplary embodiment is computer program product comprising a computer readable storage medium having program instructions embodied therewith. The program instructions are executable by a device to cause the device to perform operations comprising: periodically, over at least part of a lifetime of a product circuit, monitoring quiescent current to a product circuit; and periodically, over the part of the lifetime of the product circuit, adjusting voltage to the product circuit based on the monitored quiescent current.

DETAILED DESCRIPTION OF THE DRAWINGS

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Figure 1:
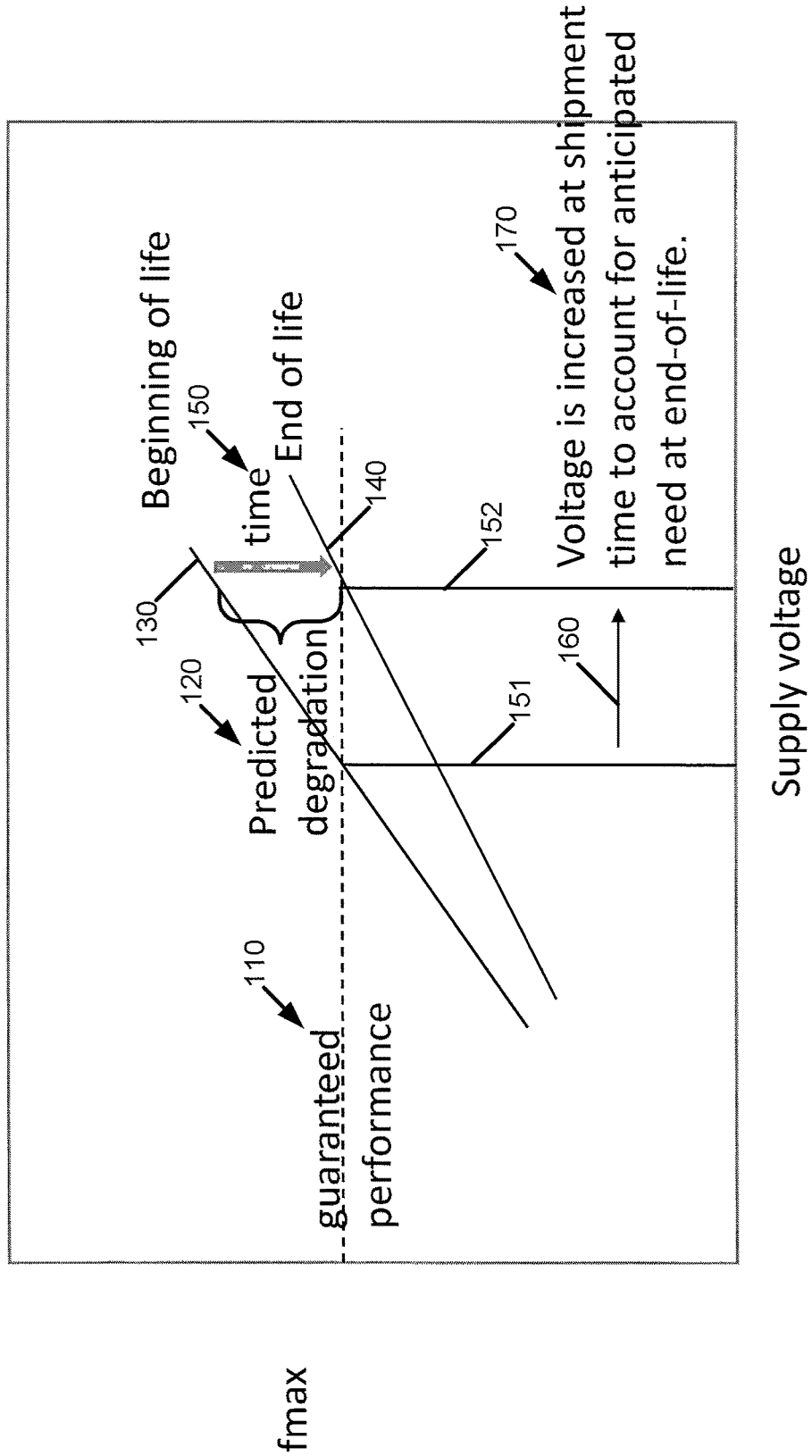
FIG. 1 is an illustration of a present guard band method as realized by the inventors, and illustrates a maximum frequency (fmax) versus a supply voltage for a circuit.

As described above, in today's common practice, static, higher-than-needed operating voltage (a so-called 'guard-band') is used to allow for correct operation throughout life of product based on predicted life-time degradation. FIG. 1 is an illustration of a present guard band method as realized by the inventors. This figure illustrates a maximum frequency (fmax) versus a supply voltage for a circuit, and a guaranteed performance 110 for the circuit is shown. The line 130 is a (e.g., linear) representation of how supply voltage influences fmax at a beginning of life for the circuit, and line 140 is a (e.g., linear) representation of how supply voltage influences fmax at an end of life for the circuit. The predicted degradation 120 over the time 150 is also illustrated. The predicted degradation 120 means the supply voltage is moved from the voltage 151 that is suitable to meet the guaranteed performance 110 at the beginning of life (line 130) to the voltage 152 to meet the guaranteed performance 110 at the end of life (line 140). This movement is indicated by arrow 160 and by reference 170, indicating that voltage is increased at shipment time to account for anticipated need at end-of-life.

To address these issues, in brief, we propose monitoring of quiescent current with, e.g., a dedicated measurement circuit and storing of measurement history in, e.g., hardware registers, in an exemplary embodiment. The history of measure values enables autonomic adjustment of voltage during product lifetime. Degradation may be greater or less than predicted, and should be monitored in the field. For example, low-utilization chips will always have lower power consumption, hence, less degradation. By adjusting the voltage through degradation monitoring (e.g., using quiescent current), the circuit benefits in longer lifetime and lower power in early life. For instance, in FIG. 1, using the techniques of this invention, the supply voltage could start at voltage 151 and be increased as needed over the lifetime of the circuit.

Figure 2:
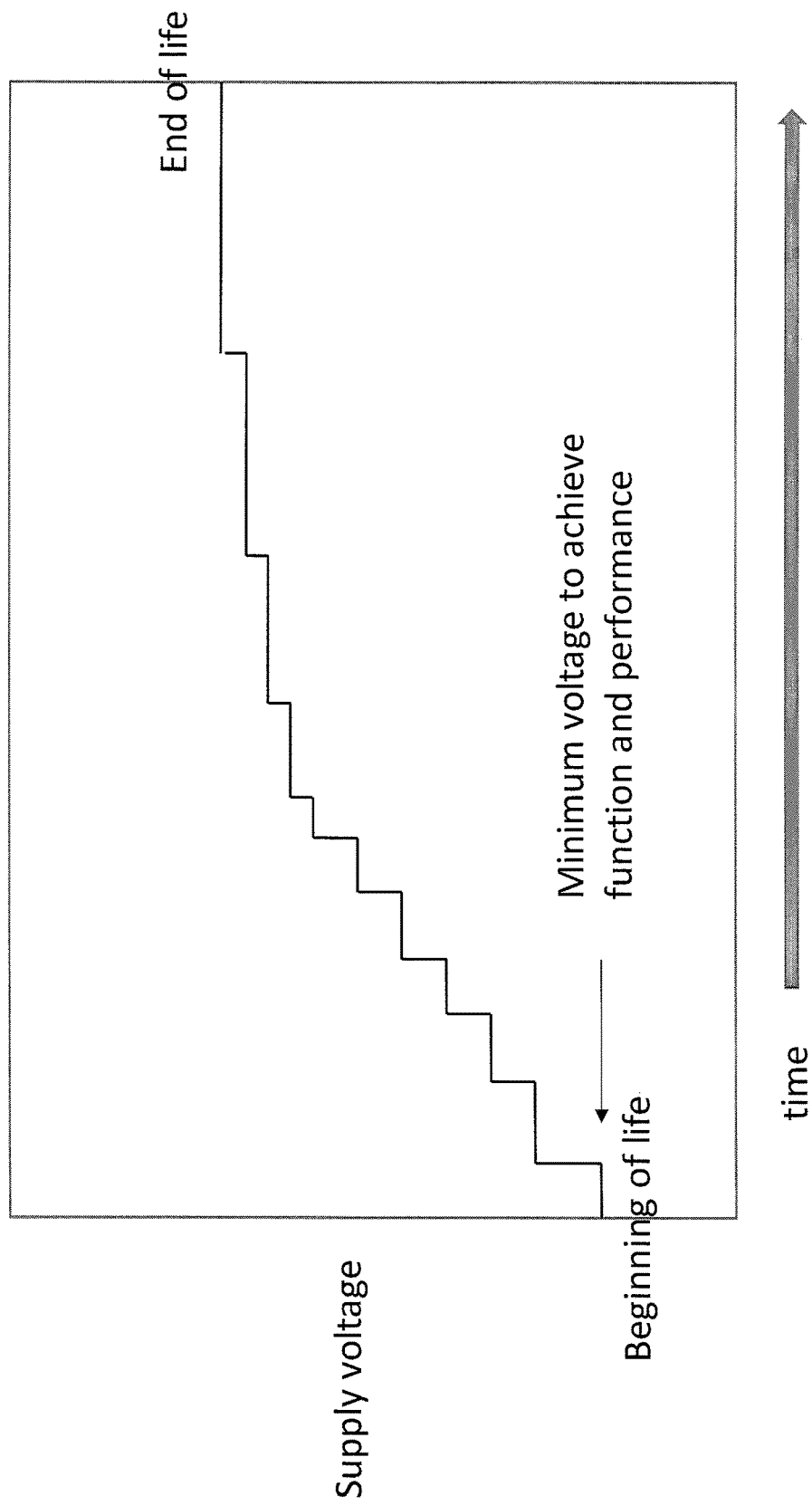
FIG. 2 illustrates a graph of supply voltage versus time in accordance with an exemplary embodiment, and illustrates voltage increases to compensate for FET degradation over the years in the field.

To support this, we need the ability to alter supply voltage in the field, based on in-field measurement of actual degradation of each circuit. Referring to FIG. 2, this figure illustrates a graph of supply voltage versus time in accordance with an exemplary embodiment. This figure also shows a principle of operation for the exemplary embodiments, where supply voltage is increased over the years in the field, to compensate for timing loss/threshold voltage shift as transistors in the circuit age. That is, instead of shipping the product with a higher supply voltage, the supply voltage is increased during the lifetime of the product based on in-field sensing of the degradation using quiescent current. With the exemplary embodiments, the aging component of the voltage guard-band is removed (although there may still be Ldi/dt and process variation components), and the circuit can run with greater energy-efficiency. Ldi/dt refers to the voltage induced by an inductor (such as a wire-bond or a long wiring line) when the current experiences a transient change.

In FIG. 2, at the beginning of life (time "zero"), this exemplary embodiment implements a minimum voltage to achieve function and performance. The supply voltage is then increased in a step-wise fashion over time, e.g., in order to maintain same level of function and performance, until the end of life.

In order to carry out operations such as those illustrated in FIG. 2 to implement the exemplary embodiments, we propose an autonomic controller (such as a microcontroller), which may perform the following operations: 1) take periodical measurement of the quiescent current and possibly translate to corresponding threshold voltage shift value or proxy for aging; 2) compare the measurement to a pre-determined value, and if the measured value is greater, the controller predicts that the threshold voltage is actually higher than expected, and a signal to raise the voltage is generated and sent to the voltage regulator; and 3) raise the voltage through a digital voltage scaling controller in a voltage regulator. The controller should be designed to address the following questions: how does it know how and when the circuit should raise voltage, and to what level should voltage be raised for reliable operations?

Figure 3A:
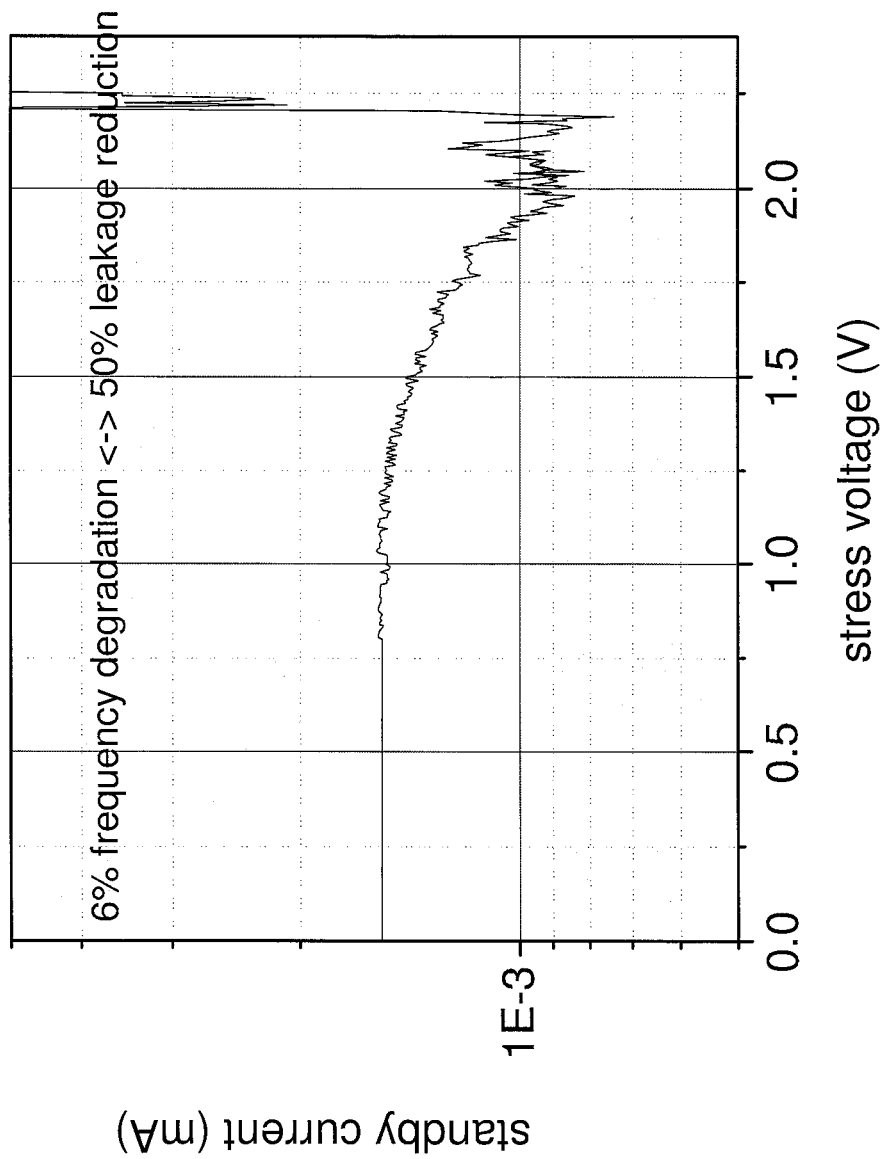
FIG. 3A is a graph illustrating standby current (in mA) versus stress voltage (in V)

To know when voltage has to be raised, we propose using measurement of quiescent current of the circuit as a proxy for FET degradation. Quiescent current is an ideal measure over circuit delay or frequency measurement of degradation, because this current is five to 10 times more sensitive to threshold voltage than gate delay. For instance, FIG. 3A and FIG. 3B demonstrate the concept using a ring oscillator circuit as an example. FIG. 3A is a graph illustrating standby current (in mA) versus stress voltage (in V). In this disclosure, standby current may be called quiescent current (and vice versa). As can be seen, quiescent current decreases as degradation, e.g., due to BTI and HCI, increases threshold voltage. When current starts to get noisy or rise, this indicates onset of oxide breakdown (TDDB). TDDB refers to the eventual breakdown (leakage followed by catastrophic leakage) of the gate dielectric of the FETs. It is noted that if there is a six (6) percent (%) frequency degradation of the ring oscillator, there is approximately a 50% leakage reduction in standby current.

Figure 3B:
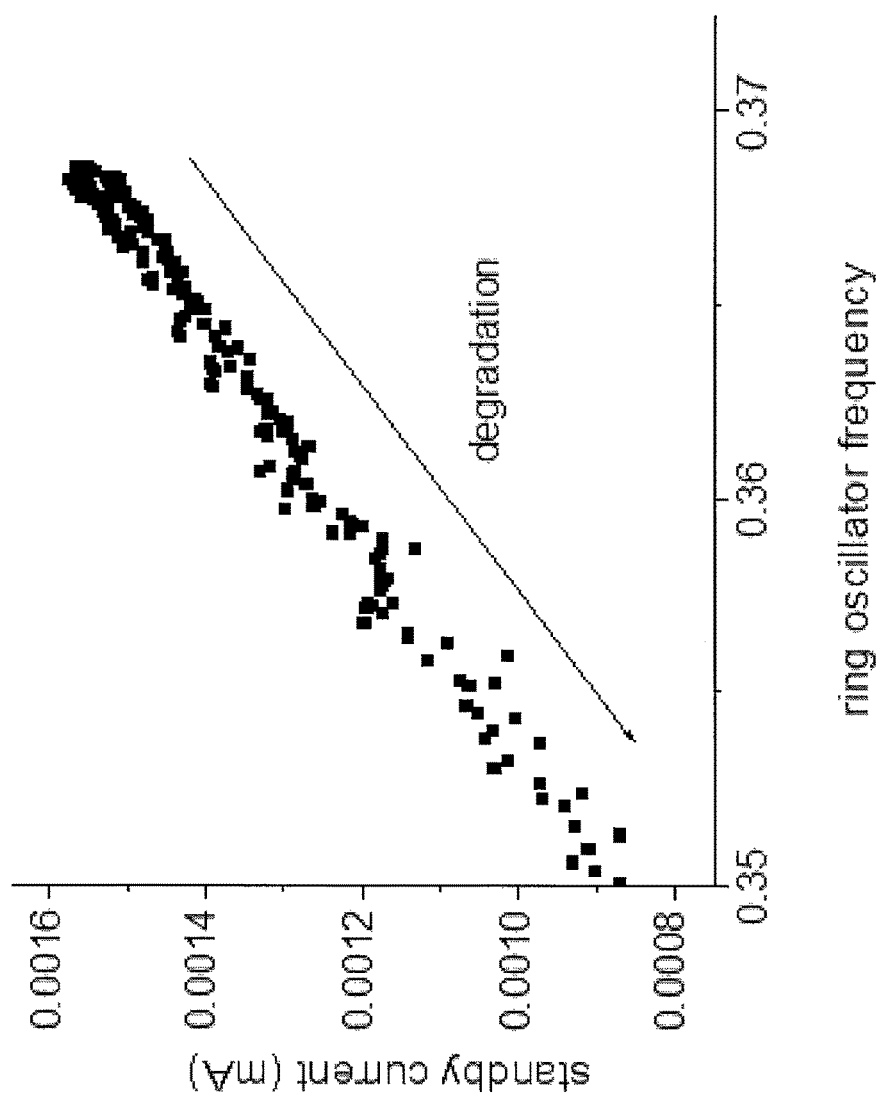
FIG. 3B is a graph illustrating standby current (in mA) versus ring oscillator frequency.

This is confirmed in part using FIG. 3B, which is a graph illustrating standby current (in mA) versus ring oscillator frequency, and further illustrates how the standby (quiescent) current is correlated to the circuit performance. In this case, the circuit is a ring oscillator, and its performance is measured by its frequency. The ring oscillator frequency is measured in MHz, but the frequency measured is actually the ring oscillator frequency divided by 128 (by an on-chip divider). As the devices degrade, the frequency goes down, and so does the standby current. This validates the description with respect to FIG. 3A, which is that measuring the decrease of the current is a means to measure the degradation of the circuit being monitored. It is believed that such current measurements are more sensitive than a performance measurement.

Quiescent current can be measured when the circuit is in non-switching mode or non-operating mode, and with its clock signals disabled. For examples of this, see, e.g., U.S. patent Ser. No. 15/060,497, entitled "On-Chip Leakage Measurement", signed Mar. 3, 2016, filed on Mar. 3, 2016, published as U.S. Publication No. 2017/0254846, or U.S. patent Ser. No. 15/230,067, "DYNAMIC PREDICTOR OF SEMICONDUCTOR LIFETIME LIMITS", signed Aug. 2, 2016, filed on Aug. 5, 2016, published as U.S. Publication No. 2018/0038906. To begin operation for a measurement, the controller puts the circuit in the quiescent mode, and takes a current measurement. For a microprocessor, a signal may be sent to inform the operating system of the impending shutdown, so that the latter will clean up its states before the actual shutdown. Then the controller compares the measured value of quiescent current to the previous value that corresponds to the circuit's current operating voltage. If the measured value is less than the previous value, this indicates that the circuit has aged sufficiently that the voltage needs to be raised by a pre-determined amount in order to maintain its specified performance and extend its lifetime.

The predetermined values are important for determining the correct voltage for reliable operations in spite of aging. The pre-determined values may be obtained through modeling at design time, where the modeling provides the working operational voltage for a range of expected threshold voltages (i.e., a range of aging) of the same circuit. The pre-determined voltage values can be set to within a margin (e.g., 10%) of the expected operational voltage, so that the controller is effectively providing an early warning before the circuit actually fails.

To raise the voltage, the controller may send a request signal to the voltage regulator, indicating the desired voltage (also obtained through the aforementioned modeling). Because the circuit is still in the quiescent measurement mode, raising the voltage does not affect the circuit's functionality. Many voltage regulators today support digital voltage scaling, where voltages can be changed based on digital signals. The concept applies to simple voltage regulators used on most mobile devices as well as multi-phase switching regulators used on server computers. After the raising of the voltage is completed, either through an acknowledgement signal from the regulator or after the controller waits for a pre-determined amount of time, the controller enables the circuit's clock signals and resumes the circuit's normal operation.

In the examples herein, two main embodiments are described: 1) firmware/software measurement and adjustment of voltage; and 2) built-in closed-loop feedback to maintain quiescent current at fixed value. The first embodiment is described in general in reference to FIGS. 4A, 4B, and 5-7. The second embodiment is described mainly in reference to FIG. 8.

Figure 4A:
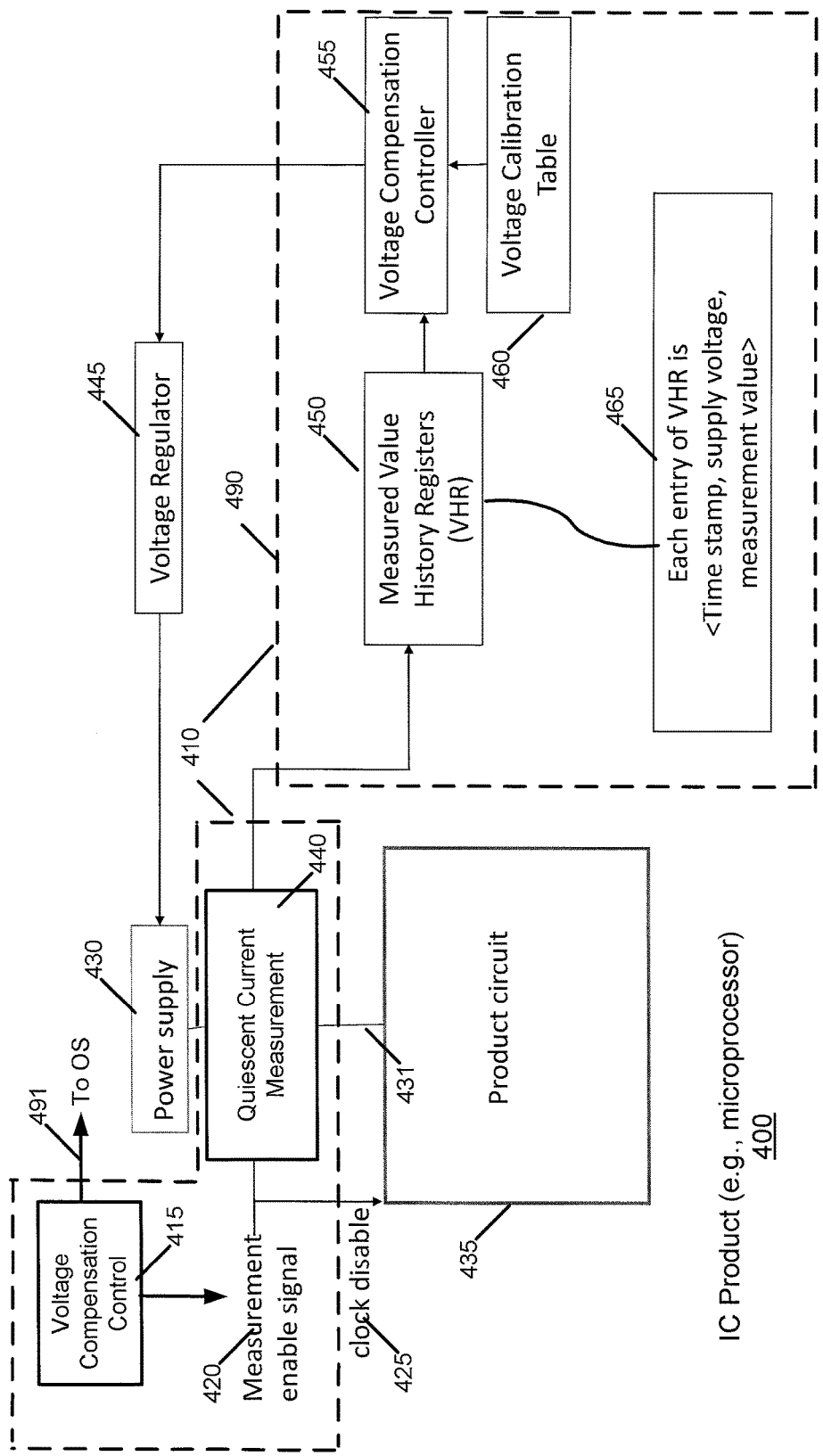
FIG. 4A illustrates one example of a system implementation for autonomic compensation for bias-temperature instability and hot carrier injection degradation of circuits.

Referring to FIG. 4A, this figure illustrates one example of a system implementation for autonomic compensation for bias-temperature instability and hot carrier injection degradation of circuits. This figure illustrates an IC product 400, which could comprise or be a microprocessor. A controller 410 performs autonomic compensation for bias-temperature instability and hot carrier injection degradation of circuits. Possible operation of the controller 410 is described in more detail in reference to FIGS. 6 and 7, but an introduction is also provided in reference to FIG. 4A. The controller 410 comprises voltage compensation control programming 415 (see also FIG. 4B), quiescent current measurement circuitry 440, measured value history registers (VHRs) 450, a voltage compensation controller 455, and a voltage calibration table 460. The IC product 400 also comprises a voltage regulator 445, a power supply 430, and a product circuit 435. The power supply's output 431 powers the product circuit 435 and is measured by the quiescent current measurement circuitry 440.

The measured VHRs 450 comprises a number of entries 465, of which one entry is shown in FIG. 4A. This entry 465 includes a time stamp (e.g., indicating a time quiescent current was measured), a supply voltage (e.g., the supply voltage at the measurement time), and a measurement value (e.g., an indication of the measured quiescent current). The voltage calibration table contains a table of quiescent current versus voltage. The voltage compensation control programming 415 causes the controller 410 to take periodical measurement of the quiescent current using the quiescent current measurement circuitry 440. A value of the quiescent current may be stored, or the voltage compensation control programming 415 can cause translation of the measured quiescent current to a corresponding threshold voltage shift value or other proxy for aging. The voltage compensation control programming 415 also causes the controller 410 to compare (e.g., using the voltage compensation controller 455) the measurement to a pre-determined value stored in the voltage calibration table. In response to the measured value being greater than a value in the voltage calibration table 460, the controller 410 predicts that the threshold voltage is actually higher than expected, and a signal to raise the voltage is generated by the voltage compensation controller 455, and the signal is sent to the voltage regulator 445. The voltage regulator 445 thereby raises the voltage, e.g., through the digital voltage scaling controller in the voltage regulator. An output of the voltage regulator 445 goes to the power supply 430, which then passes the raised voltage through the output 431 to the product circuit 435.

The voltage compensation control programming 415 produces (or causes to be produced) a measurement enable signal 420, which causes a quiescent measurement to occur using the quiescent current measurement circuitry 440. Additionally, the voltage compensation control 415 produces (or causes to be produced) a clock disable signal 425, which disables the clock for the product circuit 435. In this example, the same signal might be used for both the measurement enable signal 420 and the clock disable signal 425, but it is also possible to use two different signals. As previously described, for a microprocessor, a signal may be sent to inform the operating system of the impending shutdown, so that the latter will clean up its states before the actual shutdown. The signal 491 is a representation of the signal that is sent to the operating system (OS).

A typical scenario is the IC product 400 is one integrated circuit containing the controller 410. However, the controller 410 may be separate from the product circuit 435, e.g., on a completely different package and interconnected through a motherboard. Additionally, the controller 410 may be implemented entirely in hardware, meaning all the functionality is implemented in hardware. As another example, some or all of the controller 410 may be implemented in computer readable code (such as "microcode" for a processor) and executed by hardware (e.g., in a processor).

Figure 4B:
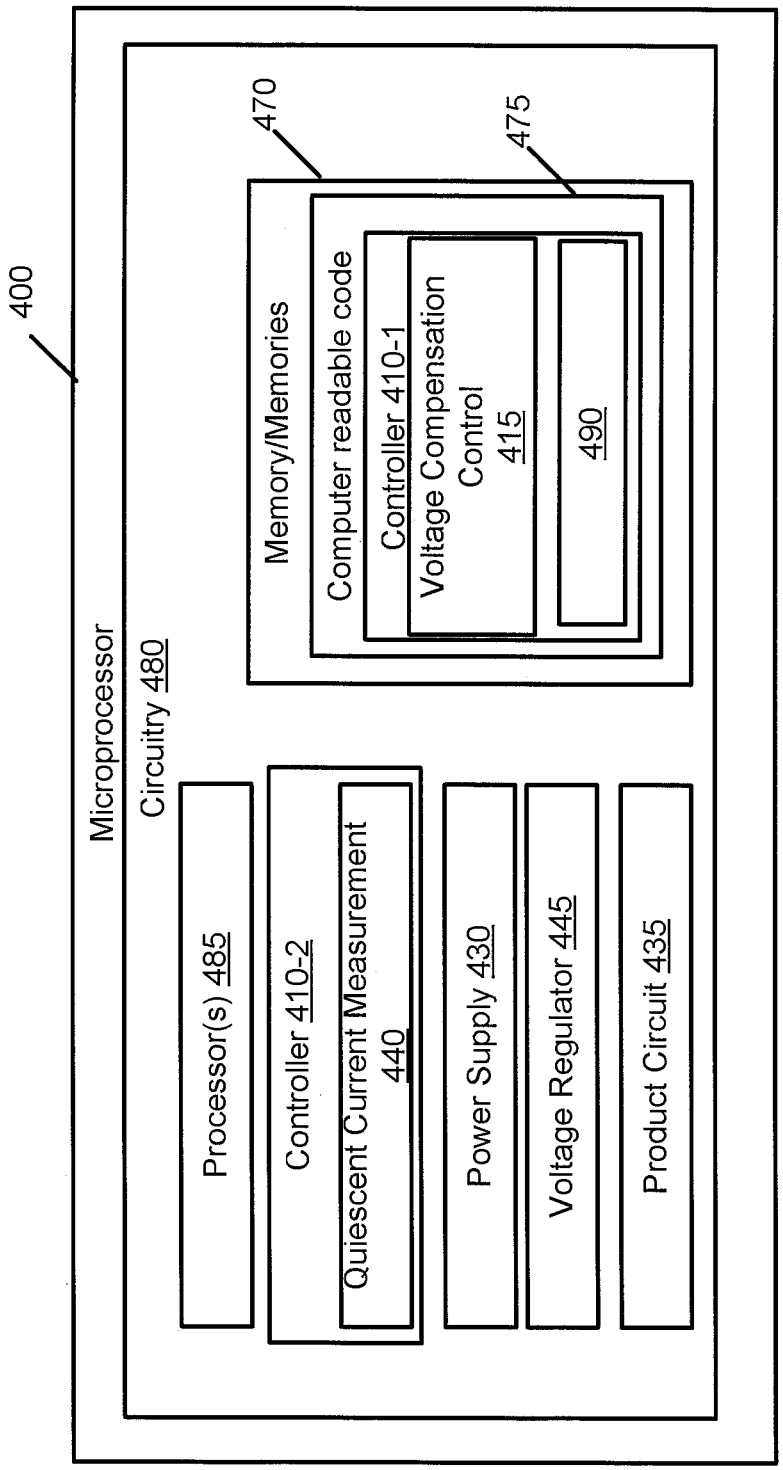
FIG. 4B is another view, in block diagram form, of one example of the system of FIG. 4A.

For example, FIG. 4B is another view, in block diagram form, of one example of the system of FIG. 4A. This example shows a microprocessor 400 that contains circuitry 480, which contains a memory or memories 470. The memory or memories 470 contain computer readable code 475. The controller 410 is implemented in part as controller 410-1 in the computer readable code 475, and is also implemented in part in the circuitry 480 as controller 410-2. The circuitry 480 also comprises one or more processors 485, the power supply 430, voltage regulator 445, and product circuit 435. In the examples of FIGS. 4A and 4B, reference 490 indicates a possible set of functions that may be implemented in computer readable code 475 as the portion of the controller 410-1. The voltage compensation control programming 415 is also typically implemented as computer readable code 475. The quiescent current measurement circuitry 440 is implemented in hardware as controller 410-2. As is known, anything implemented in the computer readable code 475 may also be implemented as hardware in circuitry 480. The memory or memories 470 may be any memories suitable for the environment, such as firmware, random-access memory, high-speed memory accessible by a processing unit (e.g., "core") of the microprocessor, read-only memory, and the like. The one or more processors 485 could have multiple cores, have a single core, be comprised of special-purpose or general-purpose processors, and the like. The one or more processors 486, in response to execution of the computer readable code 475, cause the circuitry 480 (e.g., and the microprocessor 400) to perform the operations as described herein, e.g., in reference to FIGS. 6 and 7.

Figure 5A:
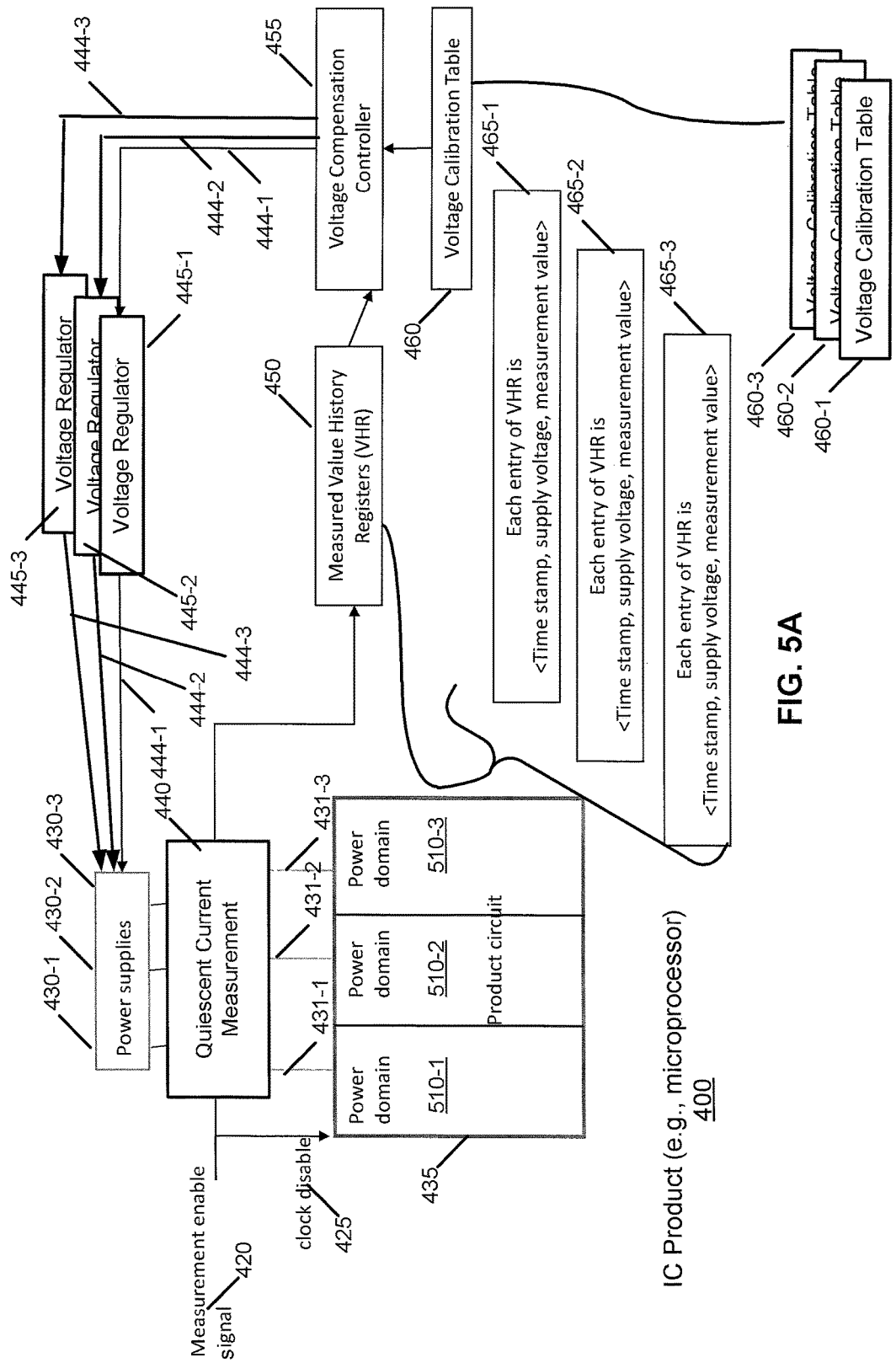
FIG. 5A illustrates another example of a system implementation, but with a multi-voltage-domain chip for autonomic compensation for bias-temperature instability and hot carrier injection degradation of circuits.

The examples of FIGS. 4A and 4B include a product circuit 435 with a single power domain. However, this system implementation can be replicated several times, each targeting a voltage domain in a chip (e.g., an integrated circuit) with multiple voltage domains. FIG. 5A illustrates an example of this, and illustrates another example of a system implementation, but with a multi-voltage-domain chip for autonomic compensation for bias-temperature instability and hot carrier injection degradation of circuits. In this example, there are multiple power supplies 430-1, 430-2, and 430-3, each of which produces an output 431-1, 431-2, or 431-3 that is routed to a corresponding power domain 510-1, 510-2, or 520-3 in the product circuit 435. In this example, there are different entries 465-1, 465-2, and 465-3 in the measured VHRs 450, each of which corresponds to a power domain 510-1, 510-2, or 510-3, respectively. In this case, the voltage compensation controller 455 would operate for each power domain 510, using corresponding entries 465. There are also parallel feedback paths 444-1, 444-2, and 444-3, each of which has a corresponding voltage regulator 445-1, 445-2, or 445-3, each of which is routed to a corresponding power supply 430-1, 430-2, or 430-3.

Figure 5B:
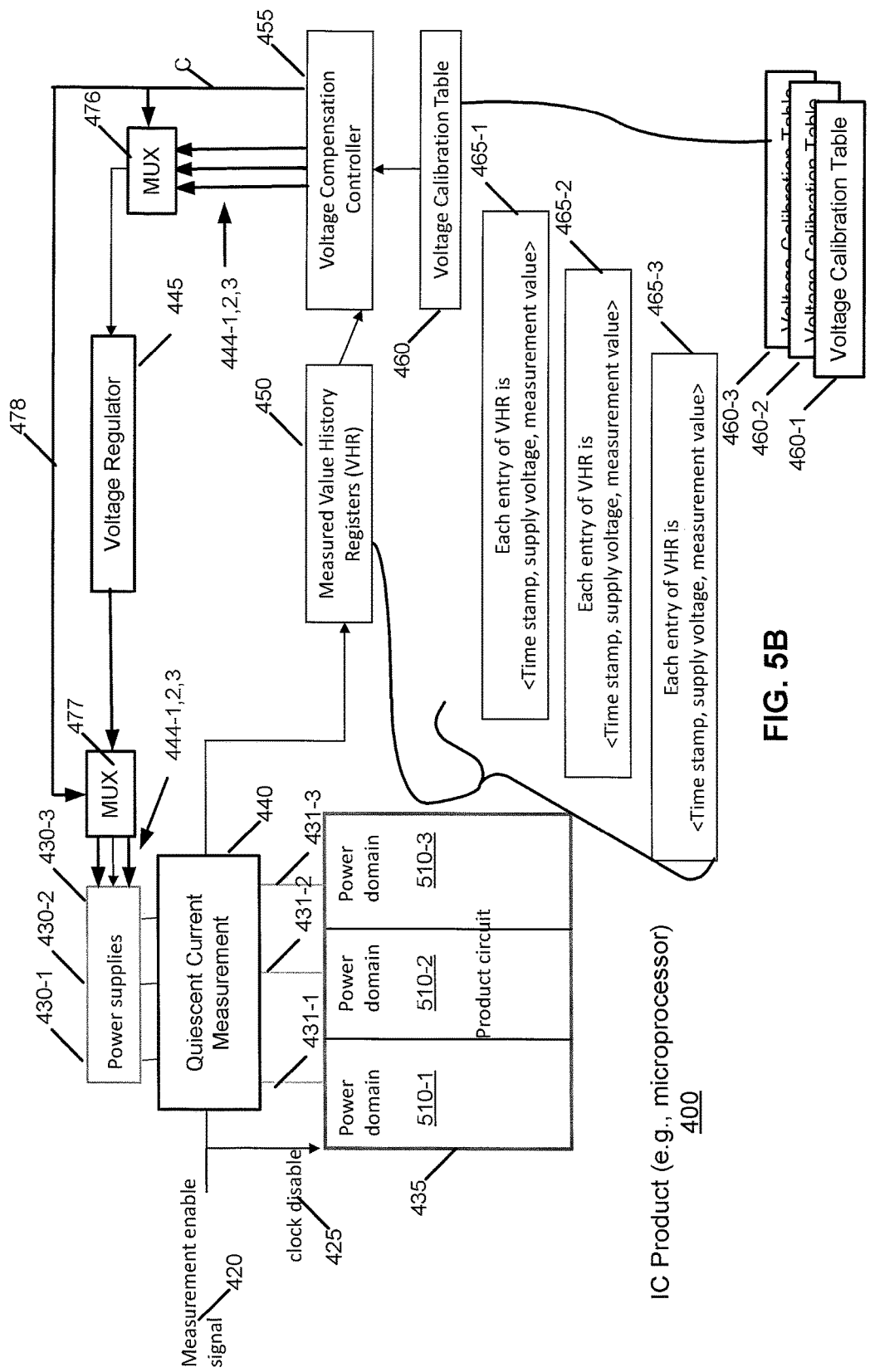
FIG. 5B illustrates a further example of a system implementation with a multi-voltage-domain chip for autonomic compensation for bias-temperature instability and hot carrier injection degradation of circuits.

FIG. 5B illustrates a further example of a system implementation with a multi-voltage-domain chip for autonomic compensation for bias-temperature instability and hot carrier injection degradation of circuits. In this example, the parallel feedback paths 444-1, 444-2, and 444-3 are multiplexed using a MUX 476 prior to a single voltage regulator 445 and then are reconstructed using the MUX 477 prior to the power supplies 430. A set of control signals C 478 are used to select which of the voltages will be used and routed to corresponding power supplies 430-1, 430-2, or 430-3.

Both FIGS. 5A and 5B illustrate that one voltage calibration table 460 may be used, or multiple tables 460 may be used. In particular, multiple voltage calibration tables 460-1, 460-2, and 460-3 may be used, and each table 460-1, 460-2 or 460-3 would correspond to one of the power domains 510-, 510-2, or 510-3, respectively. If desired, the measured VHRs 450 may also be split into three sets of registers 450, one for each of the power domains 510, making three parallel feedback paths.

Figure 6:
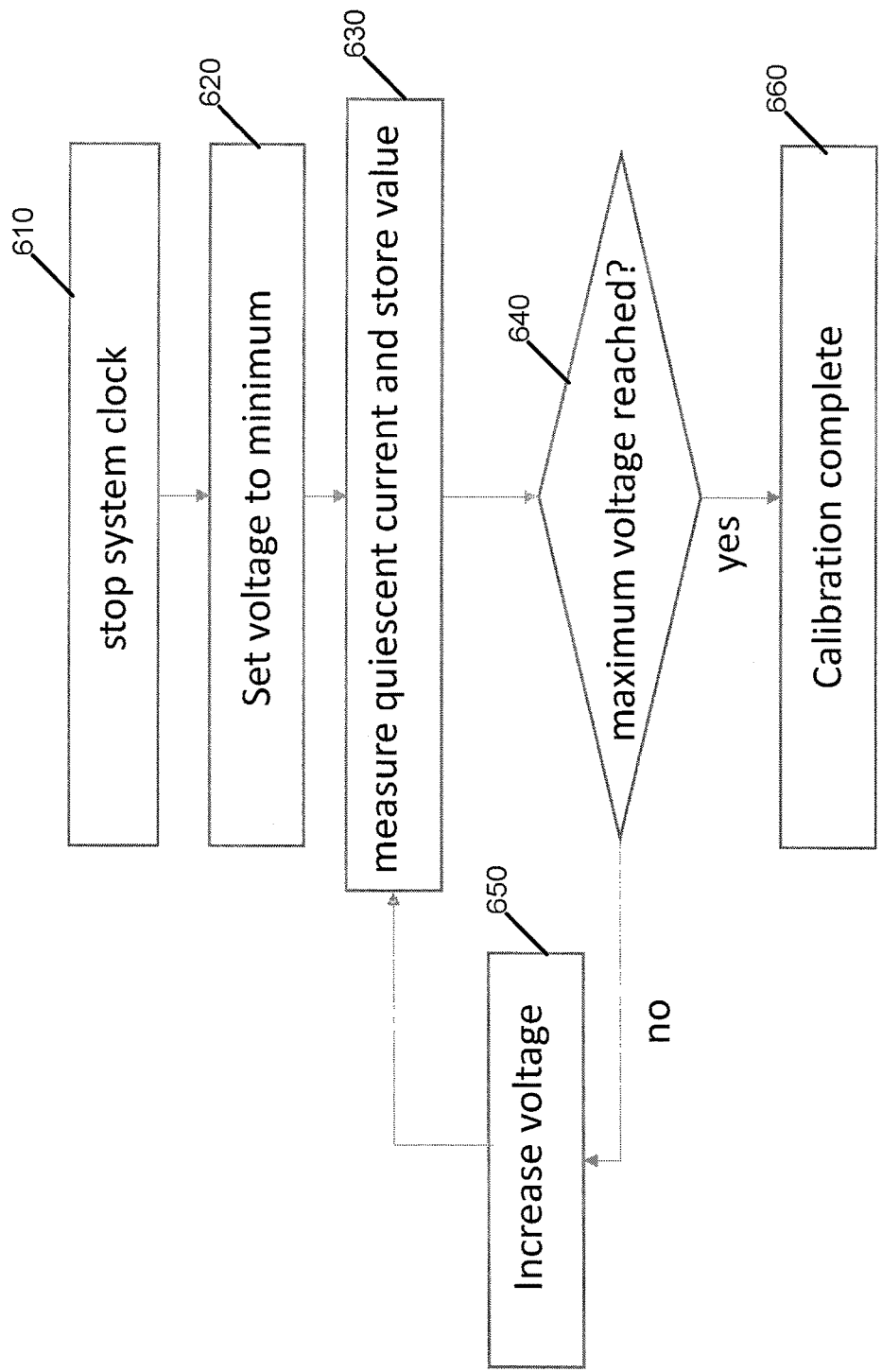
FIG. 6 is a logic flow diagram of a process used for factory calibration, and illustrates the operation of an exemplary method, a result of execution of computer program instructions embodied on a computer readable memory, functions performed by logic implemented in hardware, and/or interconnected means for performing functions in accordance with exemplary embodiments.

With respect to the first embodiment, it is possible to measure, before shipping the IC product 400, the dependence of quiescent current on voltage and store in a table (i.e., the voltage calibration table). Optionally, the same table may be used for all products. This would probably depend on the product. For a large computer system for which reliability is critical, this dependence would probably be measured separately for each shipped product. For a consumer product where lifetime is of less concern, an identical table might be used for all products from a manufacturing lot. Furthermore, the table can be based on an independent technology evaluation, such that actual measurements may not be performed. FIG. 6 is an example of a process for measuring the dependence of quiescent current on voltage and storing the results in a table.

Turning to FIG. 6, this figure is a logic flow diagram of a process used for factory calibration. This figure illustrates the operation of an exemplary method, a result of execution of computer program instructions embodied on a computer readable memory, functions performed by logic implemented in hardware, and/or interconnected means for performing functions in accordance with exemplary embodiments. The operations of FIG. 6 are performed by the controller 410 (e.g., under control of the voltage compensation control programming 415), which causes the IC product 400 to perform the operations in FIG. 6.

In block 610, the controller 410 causes the system clock to be stopped, e.g., by using the clock disable signal 425 (see FIG. 4). In block 620, the controller 410 causes the voltage to be set to the minimum, e.g., using quiescent current measurement circuitry 440, voltage regulator 445, and power supply(ies) 430. In block 630, the controller causes quiescent current to be measured and the value of this measurement to be stored, e.g., using quiescent current measurement circuitry 440 and the measurement enable signal 420. It is assumed that this would result in a list of discrete measurements over the voltage range of the voltage regulator/power supply. The number of discrete measurements and range, etc., will be engineered according to the technology and product. It is determined in block 640 if the maximum voltage is reached. If not (block 640=No), in block 650, the controller 410 causes the voltage to be increased (e.g., using quiescent current measurement circuitry 440, voltage regulator 445, and power supply(ies) 430), and the flow proceeds to block 630. If the maximum voltage is reached (block 640=Yes), then the calibration is complete (block 660).

Figure 7:
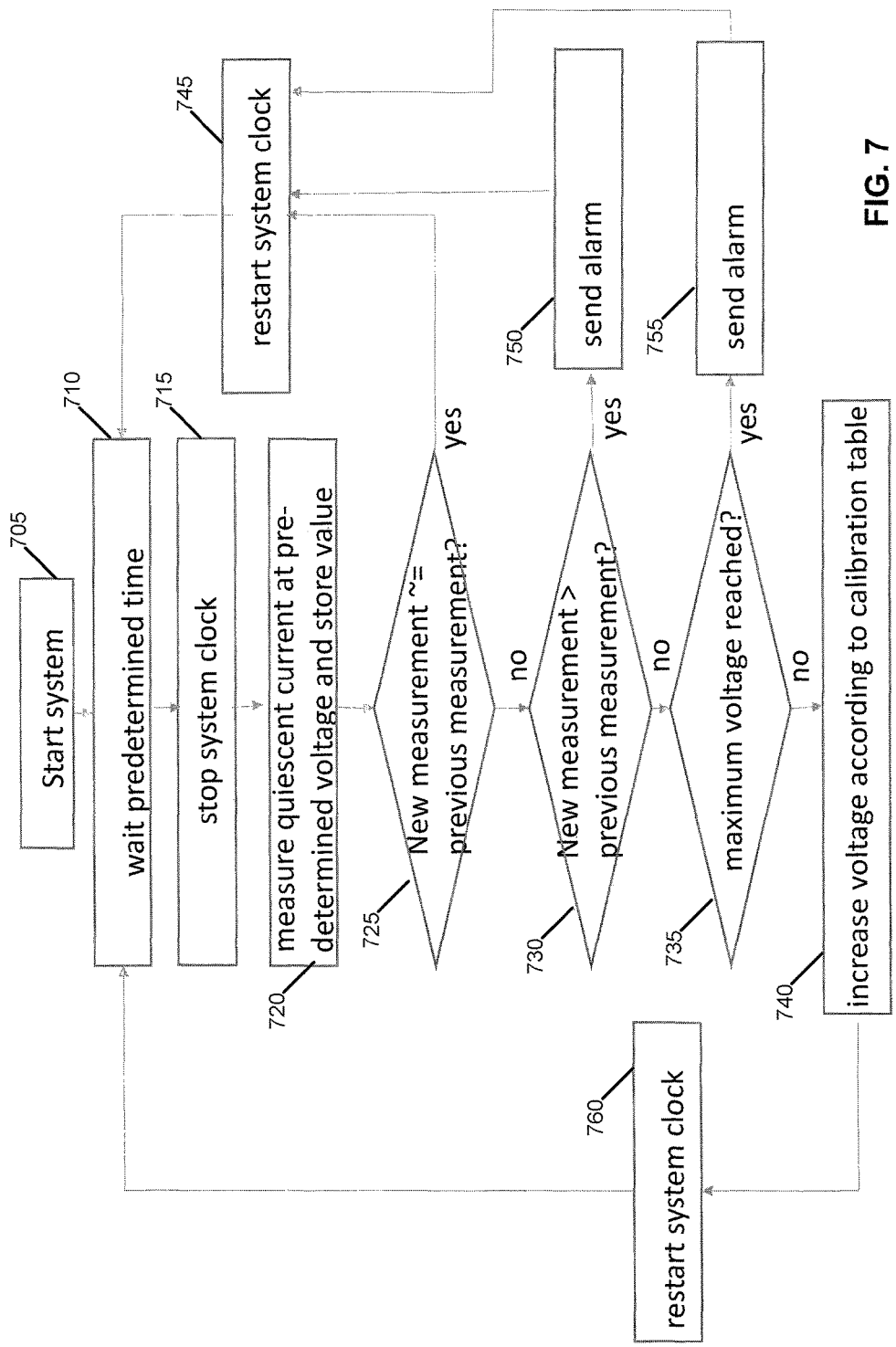
FIG. 7 is a logic flow diagram of a process used for operation of shipped system, and illustrates the operation of an exemplary method, a result of execution of computer program instructions embodied on a computer readable memory, functions performed by logic implemented in hardware, and/or interconnected means for performing functions in accordance with exemplary embodiments.

Regardless of how the information in the voltage calibration table 460 is created, in the field, the controller 410 causes the IC product 400 to periodically (e.g., once per day) stop clocks and measure quiescent current, and then to adjust (if necessary) the power supply voltage accordingly. FIG. 7 is a logic flow diagram of a process used for operation of shipped system, as an example of this process. FIG. 7 also illustrates the operation of an exemplary method, a result of execution of computer program instructions embodied on a computer readable memory, functions performed by logic implemented in hardware, and/or interconnected means for performing functions in accordance with exemplary embodiments. The controller 410 (e.g., under control of the voltage compensation control programming 415) causes the IC product 400 to perform many of the operations in FIG. 7.

In block 705, the system starts. That is, the product circuit IC product 400 starts the power supply, the system clock, and the product circuit 435. In block 710, the controller 410 waits a predetermined time. As described above, this might be scheduled such that the controller 410 takes a measurement once a day, once a week, or the like. The predetermined time is configured after startup based on this measurement cycle. In block 715, the controller 410 stops the system clock, e.g., using the clock disable signal 425. It is noted that system clock can be maintained, but the clock to the circuit block being measured must be stopped. In block 720, the controller 410 causes the quiescent current to be measured at a pre-determined voltage, e.g., using the measurement enable signal 420 and the quiescent current measurement circuitry 440. The quiescent current being measure is the current going to the entire circuit block, such as the product circuit 435 or a power domain 510. The controller 410 also causes the measurement value to be stored (e.g., using the quiescent current measurement circuitry 440 and into the measured VHRs 450).

In block 725, it is determined whether the new measurement of quiescent current is about (that is, within some tolerance) equal to the value of the previous measurement of quiescent current. If so (block 725=Yes), the controller 410 causes the system clock to be restarted in block 745, e.g., again using the clock disable signal 425. If the measurement of quiescent current is not about (that is, within some tolerance) equal to the value of the previous measurement of quiescent current (block 725=No), the flow proceed to block 730, where it is determined if the new measurement of quiescent current is greater than the previous measurement of quiescent current. If the new measurement is greater than the previous measurement (block 730=Yes), an alarm is sent in block 750. The alarms is sent to some system supervisor (e.g., a human), such as via email, an alarm on a GUI, and the like. This alarm occurs because the quiescent current should not increase over time (see FIG. 3B as an example of this) and should instead decrease over time. An increase of current indicates the possibility of oxide breakdown leading to permanent failure of the circuit.

The flow proceeds to block 745.

If the new measurement is less than or equal to the previous measurement (block 730=No), the flow proceeds to block 735, where it is determined if the maximum voltage is reached. It is noted that a tolerance could be used in block 730, but the use of the tolerance and the tolerance value would be engineering decisions. If so (block 735=Yes), then in block 755, an alarm is sent. The alarm is sent to indicate no more voltage is available for autonomic supply voltage compensation. Note that one alarm may be sent and additional alarms not sent, if the flow of FIG. 7 is continued to be performed once maximum voltage is met. Alternatively, the flow of FIG. 7 may cease to be performed once the maximum voltage is reached. If the maximum voltage is not reached (block 735=No), then the controller 410 causes the voltage to be increased as per the calibration table 460. See block 740. For instance, the controller 410 might compare the new quiescent current with a stored quiescent current (and corresponding voltage), then select the voltage based on this comparison. The controller 410 can use the voltage compensation controller 455, the voltage regulator 445, and the power supply 430 to achieve this. The flow then proceeds to block 760, where the system clock is restarted (e.g., by the controller 410 using the clock disable signal 425).

Note that flows for both blocks 750 and 755 and block 725 (Yes) proceed to block 745, where the system clock is restarted. The flows for both blocks 760 and 745 proceed to block 710, where the controller 410 again waits until the next time to measure quiescent current.

Note that for FIG. 5, which shows multiple power domains, blocks 710-760 in FIG. 7 would be run for each power domain, although the system clock would remain stopped until all power domains 510 have been addressed.

Figure 8:
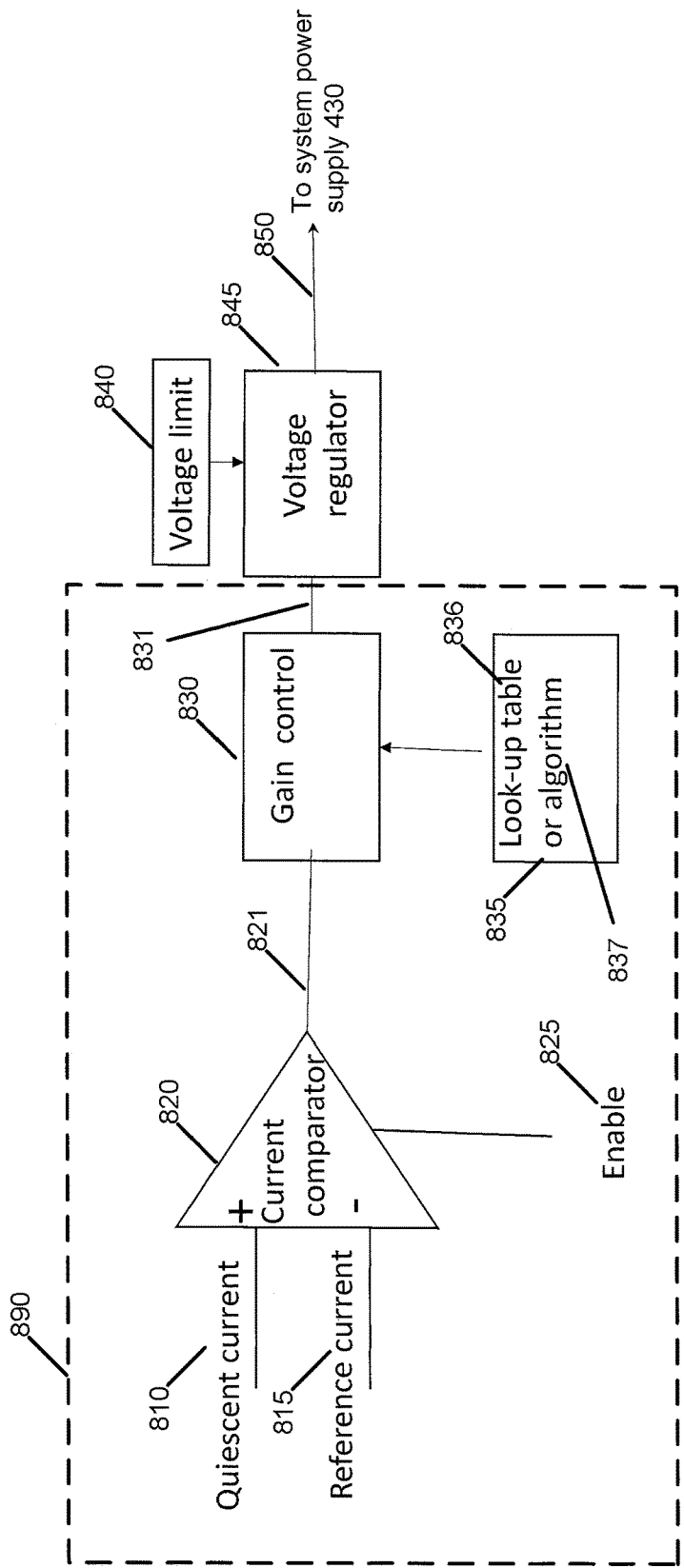
FIG. 8 is a block diagram of a closed loop feedback system in accordance with an exemplary embodiment.

With respect to the second embodiment, FIG. 8 is a block diagram of a closed loop feedback system. The portion 890 (a gain modification circuit) of the closed loop feedback system in FIG. 8 replaces the portion of the controller 410 that is indicated in FIG. 4A using reference 490. Note also that there would be one version of FIG. 8 for each power domain in FIGS. 5A and 5B. In this example, the gain modification circuit 890 comprises a current comparator 820, a gain control circuit 830, and tabulated values 835. The current comparator 820 compares quiescent current 810 and a reference current 815, and produces an output 821. The controller 410 enables the current comparator 820 using the enable signal 825, e.g., to cause periodic comparison. The output 821 is fed into a gain control 830, which uses input from the tabulated values 835, which is a look-up table 836 or algorithm 837 in this example, to determine whether or not the current voltage should be increased or left the same. The lookup table 836 is fixed for the technology, or could be customized for the product part, based on tests, but is not updated. The algorithm 837 would be an equation-based replacement for the look-up table 836. The gain control 830 produces a gain output 831 that is sent to a voltage regulator 845. This voltage regulator 845 has an input of a voltage limit 840, and produces an output 850 that is sent to the system power supply 430.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following abbreviations that may be found in the specification and/or the drawing figures are defined as follows:
% percent
BTI bias-temperature instability
CMOS complementary metal-oxide-semiconductor
FET field effect transistor
HCI hot-carrier injection
IC integrated circuit
mA milliamp
MHz megahertz
MUX multiplexer
OS operating system
TBBD time-dependent dielectric breakdown
V volts
VHR value history registers

What is claimed is:

1. A method, comprising:
periodically, over at least part of a lifetime of a product circuit, monitoring quiescent current to a product circuit, wherein periodically monitoring quiescent current comprises measuring at a measurement time quiescent current to the product circuit; and
periodically, over the part of the lifetime of the product circuit, increasing voltage output by a power supply to the product circuit based on the monitored quiescent current, wherein periodically increasing voltage output by the power supply to the product circuit based on the monitored quiescent current further comprises:
performing a comparison using the measured quiescent current with values stored in a table in order to determine whether one or more circuits in the product circuit have experienced degradation over time, wherein the values were stored in the table prior to the measurement time; and
increasing the voltage output by the power supply to the product circuit from a current voltage to a higher voltage based on the measured quiescent current.

2. The method of claim 1, wherein:
measuring at a measurement time quiescent current to the product circuit further comprises:
stopping a system clock;
measuring the quiescent current to the product circuit;
storing a value of the quiescent current as a new value of quiescent current;
comparing the new value of the quiescent current with a previous value of the quiescent current taken at a previous measurement; and
restarting the system clock after voltage increase or after a determination no voltage increase is to be made; and
the periodically increasing the voltage is performed in response to the new value being less than the previous value, wherein increasing a voltage output by a power supply to the product circuit from a current voltage to a higher voltage based on the measured quiescent current meeting a criterion further comprises increasing the voltage output by the power supply to the product circuit from the current voltage to the higher voltage based on the new value of the quiescent current being less than the previous value of the quiescent current and based on the current voltage being less than or equal to a maximum voltage of the power supply.

3. The method of claim 1, wherein increasing a voltage output by a power supply to the product circuit from a current voltage to a higher voltage based on the measured quiescent current further comprises increasing the voltage according to data stored in the table.

4. The method of claim 1, wherein the method is performed for each one of multiple power domains in the product circuit.

5. An apparatus, comprising:
a product circuit;
a power supply and a voltage regulator; and
a controller configured to periodically, over at least part of a lifetime of a product circuit, monitor quiescent current to the product circuit, and to periodically, over the part of the lifetime of the product circuit, increase voltage output by the power supply to the product circuit based on the monitored quiescent current, wherein the controller comprises:
quiescent measurement circuitry configured to measure the quiescent current to the product circuit; and
a voltage compensation controller, wherein the quiescent measurement circuitry periodically monitors quiescent current at least by measuring at a measurement time quiescent current to the product circuit; and wherein the voltage compensation controller periodically increases the voltage output by the power supply to the product circuit based on the monitored quiescent current, at least by:

performing a comparison using the measured quiescent current with values stored in a table in order to determine whether one or more circuits in the product circuit have experienced degradation over time, wherein the values were stored in the table prior to the measurement time; and causing the voltage output by the power supply to the product circuit to be increased from a current voltage to a higher voltage based on the measured quiescent current, at least by outputting a signal to the voltage regulator to cause the voltage regulator to output a signal to the power supply to cause the power supply to increase voltage to the higher voltage.

6. The apparatus of claim 5, wherein the values were stored in the table prior to a first measurement of the quiescent current made in order to determine whether the one or more circuits in the product circuit have experienced degradation over time.

7. The apparatus of claim 5, wherein the values were stored in the table in response to a calibration procedure performed by a factory as part of manufacturing the product circuit.

8. The apparatus of claim 7, wherein the calibration procedure comprises the following:
stopping a system clock;
setting a selected voltage to a minimum voltage produced by the power supply;
setting a voltage to the product circuit at the selected voltage;
measuring a quiescent current to the product circuit at the selected voltage;
storing a representation of the quiescent current, corresponding to the selected voltage, in the table;
setting the selected voltage to a higher voltage;
continuing to set the voltage to the product circuit at the selected voltage, measuring, storing, and setting the selected voltage to a higher voltage until a maximum voltage of the power supply is reached.

9. The apparatus of claim 5, wherein:
the controller is configured to stop a system clock;
the quiescent measurement circuitry is configured to measure the quiescent current to the product circuit and to store a value of the quiescent current as a new value of quiescent current;
the voltage compensation controller is configured to compare the new value of the quiescent current with a previous value of the quiescent current taken at a previous measurement and to increase the voltage output by the power supply to the product circuit from the current voltage to the higher voltage based on the new value of the quiescent current being less than the previous value of the quiescent current; and
the controller is configured to restart the system clock after voltage is increased or after a determination no voltage increase is to be made.

10. The apparatus of claim 9, wherein the controller is configured to send an alarm in response to the maximum voltage of the power supply being reached.

11. The apparatus of claim 9, wherein the controller is configured to determine the new value of the quiescent current is greater than the previous value of the quiescent current and to send an alarm in response to the new value of the quiescent current is greater than the previous value of the quiescent current.

12. The apparatus of claim 9, wherein the controller is further configured, prior to stopping the system clock, to send a signal toward an operating system to inform the operating system the system clock will be stopped.

13. The apparatus of claim 9 wherein:
the quiescent current measuring circuitry is configured to store, along with the value of the new value of quiescent current, a time stamp indicating a measurement time of the new value of the quiescent current and a value of a current supply voltage at which the new value of the quiescent current was determined; and
the quiescent current measuring circuitry is configured to compare the new value of the quiescent current with the previous value of the quiescent current taken at a previous measurement uses measurement times for each of the new value and previous value of the quiescent current.

14. The apparatus of claim 5, wherein increasing the voltage output by the power supply to the product circuit from a current voltage to a higher voltage based on the measured quiescent current further comprises increasing the voltage according to data stored in the table.

15. The apparatus of claim 5, wherein the product circuit comprises multiple power domains, each powered from a different power supply, and wherein the controller is configured to perform the periodic measuring and the periodic increasing of the voltage of a corresponding different power supply for each one of multiple power domains in the product circuit.

16. An apparatus, comprising:
a product circuit;
a power supply and a voltage regulator; and
a controller configured to periodically, over at least part of a lifetime of a product circuit, monitor quiescent current to the product circuit, and to periodically, over the part of the lifetime of the product circuit, increase voltage output by the power supply to the product circuit based on the monitored quiescent current, and wherein the controller comprises:
quiescent measurement circuitry configured to measure the quiescent current to the product circuit; and
a gain modification circuit,
wherein the quiescent measurement circuitry periodically monitors quiescent current at least by measuring at a measurement time quiescent current to the product circuit; and
wherein the gain modification circuit is configured to compare the measured quiescent current with a reference current and uses an output of the comparison and tabulated values to determine whether to change a signal to the voltage regulator to cause the voltage regulator to output a signal to the power supply to cause the power supply to increase voltage from a current voltage to a higher voltage.

17. The apparatus of claim 16, wherein the tabulated values are tabulated in a look-up table or the tabulated values are determined using an algorithm and wherein the gain modification circuit comprises:
a current comparator configured to perform the comparison of the measured quiescent current with a reference current to produce the output of the comparison; and a gain control circuit configured to use the output of the comparison and the tabulated values to determine whether to change the signal to the voltage regulator.

18. The apparatus of claim 5, wherein the apparatus comprises one or more processors and one or more memories, the one or more memories having computer readable code, and wherein the controller is implemented in part by the one or more processors, in response to executing computer readable code from the one or more memories.

19. The apparatus of claim 16, wherein the apparatus comprises one or more processors and one or more memories, the one or more memories having computer readable code, and wherein the controller is implemented in part by the one or more processors, in response to executing computer readable code from the one or more memories.

* * * * *